United States Patent
Melanson et al.

(10) Patent No.: US 6,670,902 B1
(45) Date of Patent: Dec. 30, 2003

(54) DELTA-SIGMA MODULATORS WITH IMPROVED NOISE PERFORMANCE

(75) Inventors: John Laurence Melanson, Austin, TX (US); Yu Qing Yang, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 10/162,324

(22) Filed: Jun. 4, 2002

(51) Int. Cl.[7] .................................................. H03M 3/00
(52) U.S. Cl. ........................................ 341/143; 341/150
(58) Field of Search .............................. 341/143, 144, 341/155, 150, 172, 153

(56) References Cited

U.S. PATENT DOCUMENTS 5,079,550 A * 1/1992 Sooch et al. ................ 341/143
5,461,381 A * 10/1995 Seaberg ....................... 341/143
6,184,811 B1 * 2/2001 Nagari et al. ................ 341/143
6,252,531 B1 * 6/2001 Gordon et al. ............... 341/143

* cited by examiner

Primary Examiner—Peguy JeanPierre
(74) Attorney, Agent, or Firm—James J. Murphy; Winstead Sechrest & Minick P.C.

(57) ABSTRACT

An integrator stage for use in a delta sigma modulator includes an operational amplifier, an integration capacitor coupling an output of the operational amplifier and a summing node at an input of the operational amplifier, and a feedback path. The feedback path includes first and second capacitors having first plates coupled electrically in common at a common plate node and switching circuitry for sampling selected reference voltages onto second plates of the capacitors during a sampling phase. The integrator stage further includes a switch for selectively coupling the common plate node and the summing node during an integration phase.

25 Claims, 5 Drawing Sheets

DELTA-SIGMA MODULATORS WITH IMPROVED NOISE PERFORMANCE

BACKGROUND OF THE INVENTION

1. Field of the Invention

The present invention relates in general to switched-capacitor techniques and in particular to delta-sigma modulators with improved noise performance.

2. Description of the Related Art

Delta-sigma modulators are particularly useful in digital to analog and analog to digital converters (DACs and ADCs). Using oversampling, the delta-sigma modulator spreads the quantization noise power across the oversampling frequency band, which is typically much greater than the input signal bandwidth. Additionally, the delta sigma modulator performs noise shaping by acting as a lowpass filter to the input signal and a highpass filter to the noise; most of the quantization noise power is thereby shifted out of the signal band.

The typical delta sigma modulator includes a summer summing the input signal with negative feedback, a linear filter, quantizer and a feedback loop with a digital to analog converter coupling the quantizer output and the inverting input of the summer. In a first order modulator, the linear filter comprises a single integrator stage while the filter in a higher order modulator comprises a cascade of a corresponding number of integrator stages. The quantizer can be either a one-bit or a multiple-bit quantizer. Higher-order modulators have improved quantization noise transfer characteristics over those of lower order, but stability becomes a more critical design factor as the order increases.

Switched-capacitor filters/integrators are useful in a number of applications including the integrator stages in delta sigma modulators. Generally, a basic differential switched-capacitor integrator samples the input signal onto sampling capacitors during the sampling (charging) phase. A reference voltage may also be sampled onto a reference sampling capacitors during this phase. During the following dump phase, the charge on the sampling capacitor is transferred at the summing node of an operational amplifier to the integrator capacitor in the amplifier feedback loop. The operational amplifier drives the integrator output.

Noise performance is an important design constraint in delta-sigma modulator development. Noise can result from a number of different factors, including parasitic capacitances and timing mismatches. Hence, for applications requiring low-noise delta-sigma modulation, improved techniques for reducing noise are required.

SUMMARY OF THE INVENTION

Circuits and methods according to the inventive principles are particularly useful in improving the performance of delta sigma modulators, such as those used in digital to analog and analog to digital converters, a corresponding capacitor during a sampling phase. According to one particular embodiment, an integrator stage is disclosed for use in a delta sigma modulator includes an operational amplifier, an integration capacitor coupling an output of the operational amplifier and a summing node at an input of the operational amplifier, and a feedback path. The feedback path includes first and second capacitors having first plates coupled electrically in common at a common plate node and switching circuitry for sampling selected reference voltages onto second plates of the capacitors during a sampling phase. The integrator stage further includes a switch for selectively coupling the common plate node and the summing node during an integration phase.

Among the many advantages afforded by the application of the inventive concepts are improved noise performance and a relaxation in the design constraints on the modulator integrator stages. By isolating the reference path feedback switches from the summing nodes during sampling, non-linearities caused by parasitic capacitances of those switches can be avoided. Additionally, techniques are disclosed for implementing signal energy cancellation within the delta-sigma loop thereby reducing the in-loop noise to small amounts of quantization noise.

BRIEF DESCRIPTION OF THE DRAWINGS

For a more complete understanding of the present invention, and the advantages thereof, reference is now made to the following descriptions taken in conjunction with the accompanying drawings, in which.

DESCRIPTION OF THE PREFERRED EMBODIMENTS

The principles of the present invention and their advantages are best understood by referring to the illustrated embodiment depicted in FIG. 14 of the drawings in which like numbers designate like parts.

Figure 1:
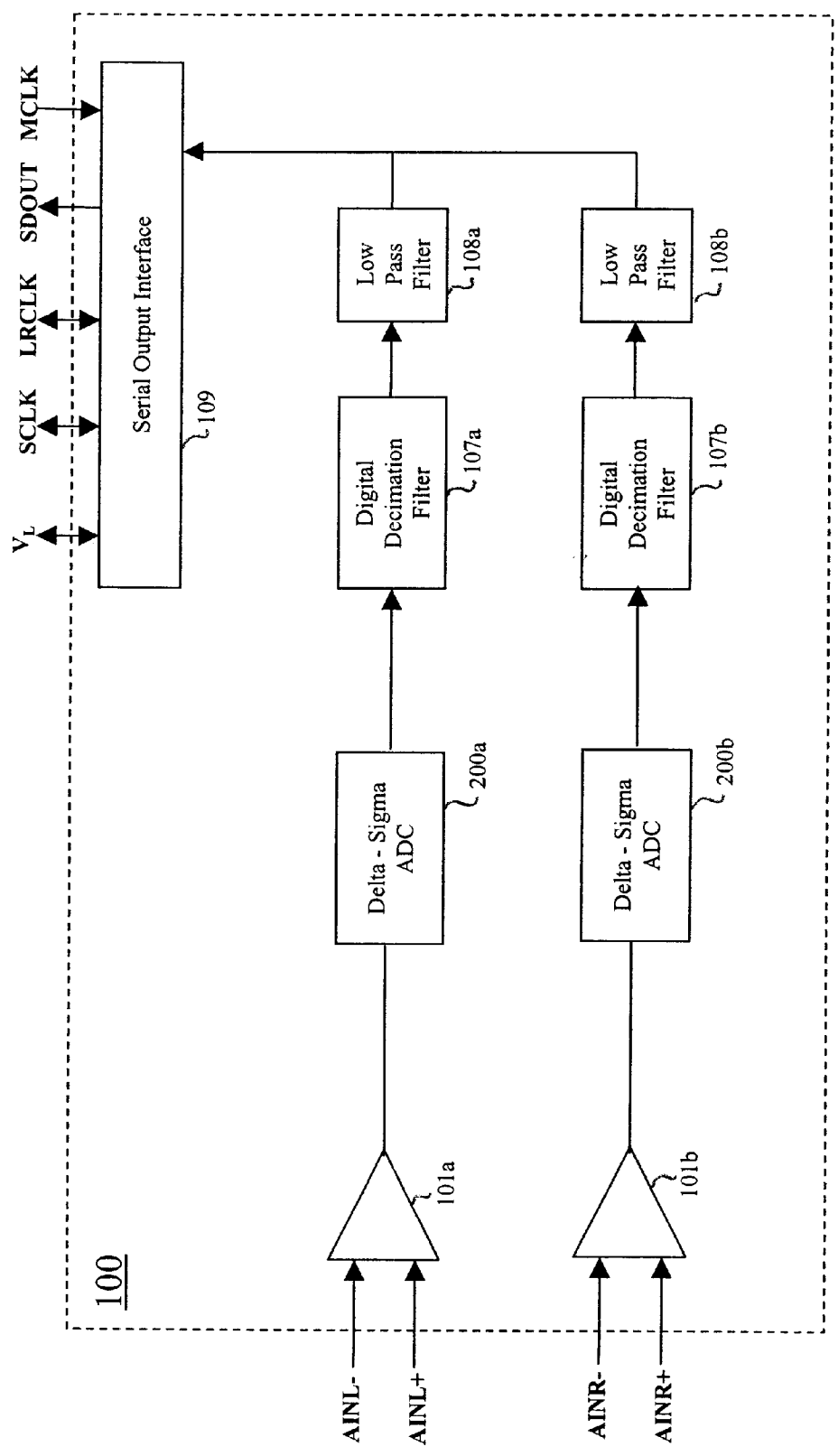
FIG. 1 is a high level functional block diagram of an analog to digital converter suitable for illustrating the application of the inventive principles.

FIG. 1 is a high-level functional block diagram of a single-chip audio analog-to-digital (A/D) 100 suitable for practicing the principles of the present invention. A/D converter 100 is only one of a number of possible applications employing delta-sigma data converters. Other examples include digital to analog converters (DACs) and Codecs.

A/D converter 100 includes two conversion paths for converting left and right channel analog audio data respectively received at left and right analog differential inputs AINL+/− and AINR+/−. The analog inputs are each passed through an input gain stage 101a–101b and then to a delta-sigma analog to a digital converter (ADC) 200a–200b, which will be described in detail in conjunction with FIG. 2. The digital outputs of delta-sigma ADCs 200a–200b are passed through a decimation filter 107, which reduces the sample rate, and a low pass filter 108. Delta sigma ADCs 200a–200b sample the analog signal at the oversampling rate and output digital data, in either single-bit or multiple-bit form depending on the quantization, at the oversampling rate. The resulting quantization noise is shaped and generally shifted to frequencies above the audio band.

The resulting left and right channel digital audio data are output through a single serial port SDOUT of serial output interface 109, timed with serial clock SCLK and left-right clock LRCLK in accordance with the Digital Interface Format (DIF). The SCLK and LRCLK clocks can be generated externally and input to converter 100 or can be generated on-chip, along with the associated data, in response to a received master clock MCLK.

Figure 2:
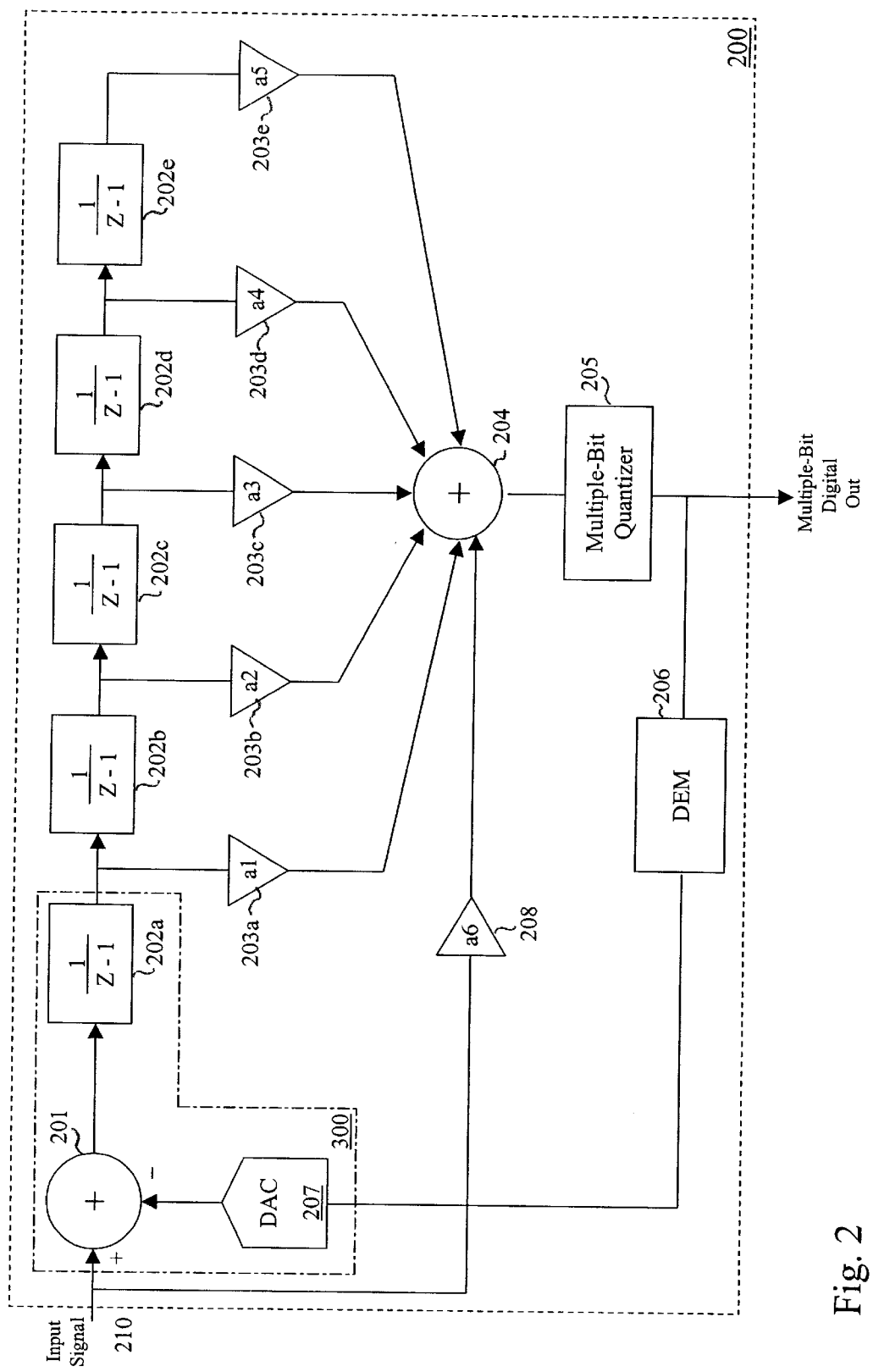
FIG. 2 is a functional block diagram of an exemplary $5^{th}$ order delta-sigma modulator suitable for use in circuits and systems such as the analog to digital converter shown in FIG. 1.

FIG. 2 is an exemplary 5th order delta-sigma modulator 200 comprising an input summer 201 and five (5) integrator stages 202a–202e. Delta sigma modulator 200 is a weighted feed-forward design in which the outputs of each of the integrator stages are passed through a gain stage (amplifier) 203a–203e to an output summer 204. Amplifiers 203a–203e allow the outputs of the integrator stages to be weighted at the summer 204 input. The output from summer 204 is quantized by a multiple-bit quantizer 205, which generates the multiple-bit digital output signal. Additionally, the output from quantizer 205 is fedback to the inverting input of summer 201 through dynamic element matching (DEM) circuitry 206 and multiple-bit digital to analog converter (DAC) 207. (A 5th order feed-forward design was selected for discussion purposes; in actual implementation; the order as well as the configuration of the modulator will vary. A general discussion of delta-sigma modulator topologies can be found in the literature, for example, in Norsworthy et al., *Delta-Sigma Data Converters, Theory, Design and Simulation*, IEEE Press, 1996).

FIG. 2 also shows an additional feed-forward path, including amplifier 208, between modulator input 210 and summer 204. The gain of amplifier stage 208 is preferably:

Gain=(1/Quantizer gain)*(1/Multi-Bit DAC gain)

The purpose of this additional feed-forward path is to cancel as much of the input signal energy from the delta-sigma loop as possible. Consequently, most of the noise within the modulator will be quantization noise. In turn, the design constraints on the sub-circuits within modulator 200 can be relaxed. For example, the first integrator stage 202a is typically the major contributor to the noise performance of the entire modulator. This feed-forward technique results in less signal energy at the output of the first integrator stage and hence such parameters as the stage opamp DC gain can be reduced. In turn, the power consumption of the device as well as the die size can be reduced.

Figure 3A:
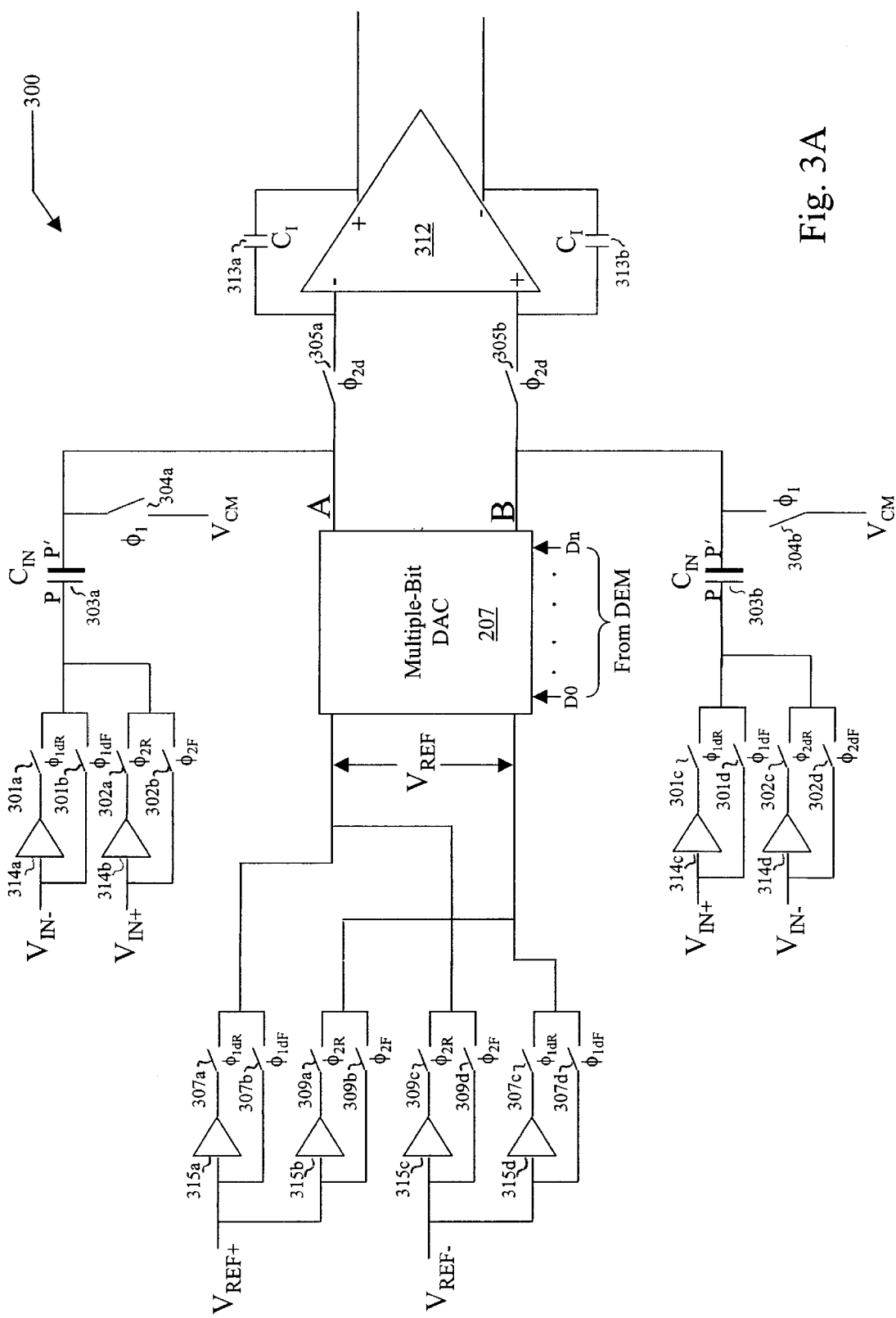
FIG. 3A is a more detailed functional block diagram of the first integrator stage and integral multiple-bit DAC shown in FIG. 2.

FIG. 3A is an electrical schematic diagram of an integral switched-capacitor summer—DAC—integrator circuit 300 corresponding to first integrator stage 202a, summer 204 and DAC 207 of delta sigma modulator 200. Generally, the design of the first integrator stage of a delta-sigma modulator is the most critical to setting the distortion performance and therefore will be the focus of the following discussion. However the concepts discussed below are useful in a number of switched capacitor applications, including various delayed and undelayed switched capacitor integrators.

Figure 4:
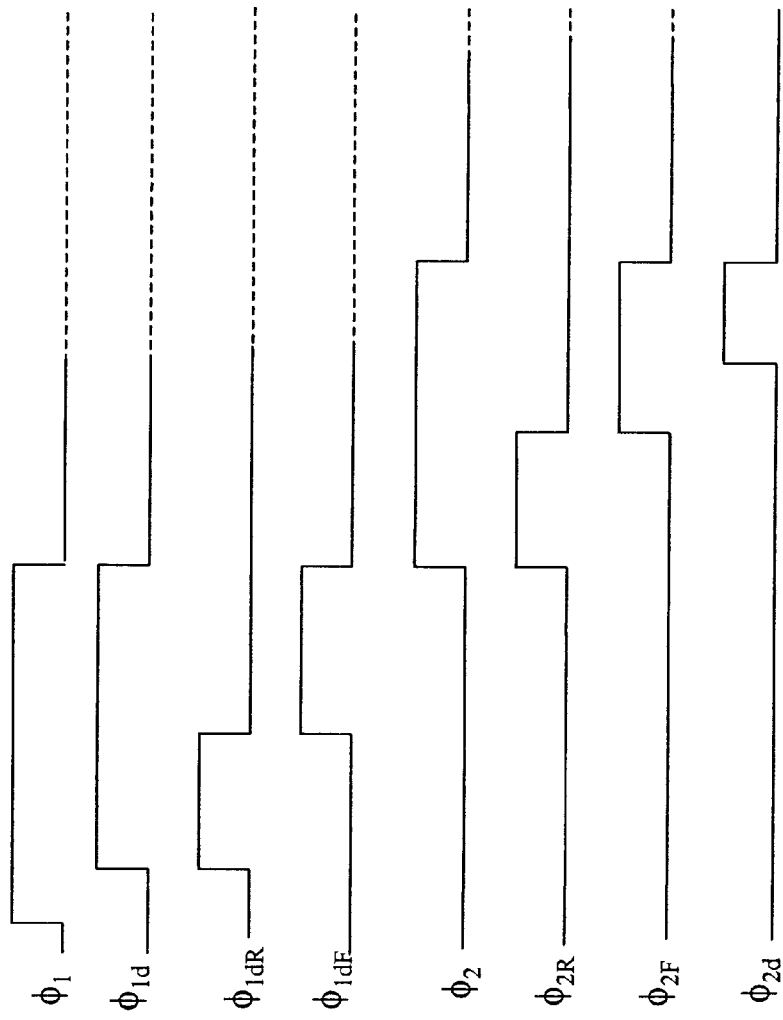
FIG. 4 is a timing diagram illustrating the operation of the delta-sigma modulator of FIG. 2.

Switched capacitor integrator 300 generally operates in two non-overlapping Phases $\phi_1$ and $\phi_2$. The timing of Phases $\phi_1$ and $\phi_2$ is shown in FIG. 4. Delayed Phases $\phi_{1d}$ and $\phi_{2d}$ are delayed versions of Phases $\phi_1$ and $\phi_2$. As will be discussed further, in the preferred embodiment each delayed phase is composed of rough (R) and fine (F) subphases (Subphases $\phi_{1dR}$, $\phi_{1dF}$, $\phi_{2dR}$, $\phi_{2dF}$). Additionally, in the illustrated embodiment, a double sampling technique is utilized to sample the input signal $V_{IN}$ and/or the reference signal $V_{REF}$. For double sampling, the input plate of the each sampling capacitor is coupled to either $V_{IN}$ or $V_{REF}$ during $\phi_1$ sampling with a given polarity. During $\phi_2$ integration, the charge on each sampling capacitor input plate is then forced to the opposite plate by reversing the polarity of the corresponding voltage at that input plate.

In the general case, switches 304a–304b close during Phase $\phi_1$. During Delayed Phase $\phi_{1d}$ switches 301a–301d and 304a–304b close and the differential input voltage $V_{IN}$ is sampled onto input sampling capacitors ($C_{IN}$) 303a–303b. Switches 302a–302d and 305a–305b are open during Phase $\phi_1$.

Also during Phase $\phi_1$ the reference voltage is sampled by DAC 207 for presentation to summing nodes A and B. Two data paths of an n-bit DAC operating in response to digital bits and their complements (D and /D) from DEM circuitry 206 are shown in further detail FIG. 3B for reference.

Generally during Phase $\phi_1$, the differential reference signal $V_{REF}$ is sampled onto reference sampling capacitors ($C_{REF}$) 306a–306b for each path by switches 307a–307d and 304a–304b (FIG. 3A). Switches 309a–309d (FIG. 3A) are open during Phase $\phi_1$. Switches 310a–310d for each path, under the control of complementary bits Dx and /Dx, couple or cross-couple the input plates of reference sampling capacitors $C_{REF}$ 306a–306b to the common plate (charge sharing) nodes A and B (where x is the index for the corresponding bit/reference sampling path from 0 to n from the quantizer and DEM circuitry). In other words, the configuration of switches 310a–310d for a given reference sampling path sets the polarity of the voltage at the input plates of capacitors 306a–306b.

During Phase $\phi_2$ the sampling switches reverse their configuration with switches 302a–302d closing and switches 301a–301d and 304a–304d opening for the input signal path. For the reference path, switches 307a–307d open and switches 309a–309d close. The charge on the input plates of capacitors $C_{IN}$ and $C_{REF}$ is forced to the output (top) plates and common plate (charge sharing) nodes A and B. During Delayed Phase $\phi_{2d}$ switches 305a–305b close to transfer the charge at common nodes A and B from the top plates of reference sampling capacitors $C_{IN}$ and $C_{REF}$ to the the summing nodes at the inverting (−) and non-inverting (+) inputs of opamp 312 (the summing nodes) and integrator capacitors ($C_1$) 313a–313b.

As previously noted, the preferred integrator 300 operates in rough and fine subphases. During Rough Delayed Subphase $\phi_{1dR}$, the input plates of sampling capacitors $C_{IN}$ and $C_{REF}$ are driven by rough buffers 314a–314d and 315a–315d which provide an increased charging current. Subsequently, input plates P are brought to their full sampling voltage during Delayed Fine Subphase $\phi_{1dF}$ by direct coupling to the corresponding input or reference voltage. More importantly, rough buffers 314 and 315 provide increased drive during Rough Delayed Subphase $\phi_{2dR}$ to rapidly slew the voltage on capacitor input plates P towards the opposite voltage to transfer the sampled charge to the top plates P' and integration capacitors $C_1$. The charge transfer is completed during Delayed Fine Subphase $\phi_{2dF}$ by direct coupling of the input and reference capacitor ($C_{IN}$ and $C_{REF}$) input plates P to the appropriate input.

According to the inventive concepts, DAC switches 310 are disposed in front of reference capacitor 306 of each reference path. In other words, switch 310 switches the charge at the input plates P of capacitors $C_{REF}$. This is in contrast to conventional designs in which the charge summing is done at output or top plates P'.

With switches 310 disposed in front of reference capacitors $C_{REF}$, the top plates of corresponding reference capacitors 306a and 306b is preferably either fabricated in common or tied together. This feature is shown generally in FIG. 3B by lines 311a–311b represent the commonality of all top plates P' of reference capacitors 306a (lines 311a) and the commonality of all top plates P' of reference capacitors 306b (lines 311b).

Figure 3B:
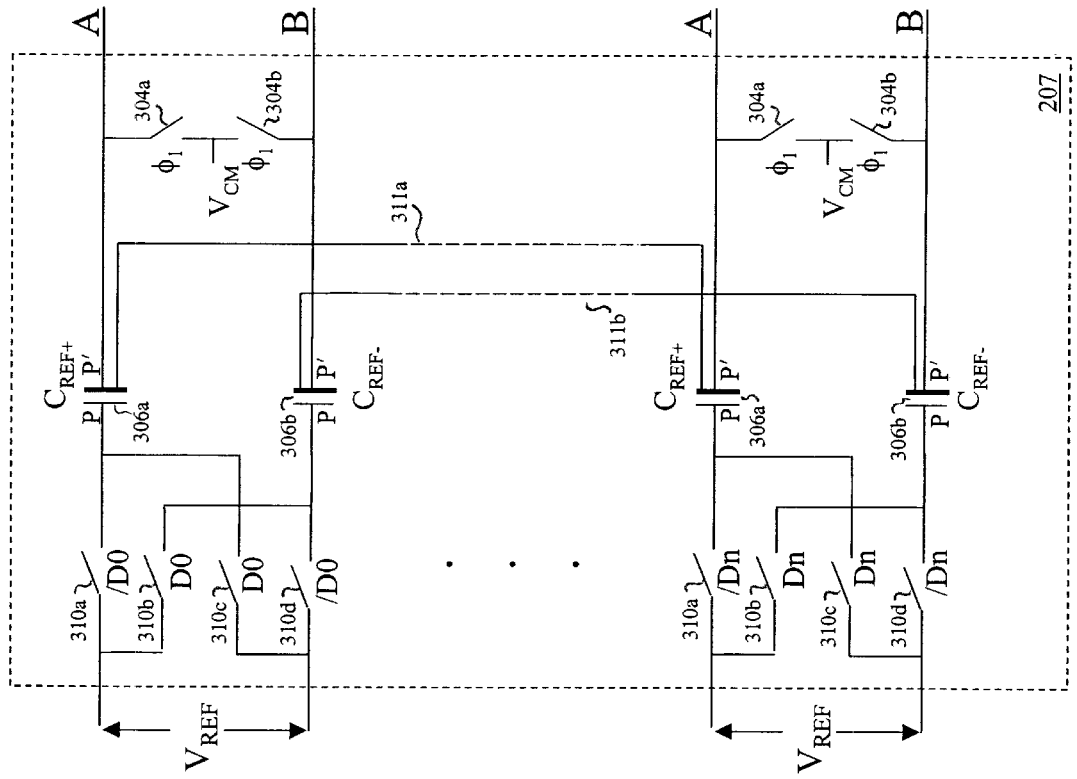
FIG. 3B is a more detailed functional block diagram of the integral multiple-bit DAC shown in FIG. 3A.
Figure 3C:
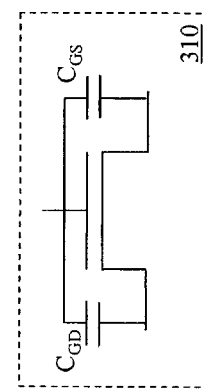
FIG. 3C is a conceptual diagram of one of the switches of FIG. 3B showing representative parasitic capacitances.

FIG. 3C is a conceptual schematic diagram of one switch 310 illustrating the gate-source parasitic capacitance $C_{GS}$ and the gate-drain parasitic capacitance $C_{GD}$. Control signals Dx and /Dx, coming from the quantizer 205 and DEM 206 circuitry, are independent of the modulator input signal. Hence, when switches 310 turn on and off, parasitic capacitances $C_{GS}$ and $C_{GD}$ charge and discharge independent of the input signal. If this charge were to be coupled into the integration capacitors $C_1$, non-linearities would appear in the opamp 312 output and consequently in the entire system in general. With the configuration of FIG. 3B however, switches 310 are isolated from the summing nodes A and B such that non-linearities are not introduced by the parasitic capacitances of switches 310.

The configuration of switches 310 by control signals Dx and /Dx is set before the start of the current $\phi_1$. In order for this "decision" to be made in sufficient time, control signals Dx and /Dx are preferably generated during $\phi_2$ of the prior cycle. This timing allows Dx and /Dx to propagate from the quantizer 206 outputs and through DEM circuitry 207 to switches 310 before the rising edge of Phase $\phi_1$ of the current cycle.

One advantage of the configuration of FIG. 3B is its ability to cancel charge at the common plate (charge sharing) nodes A and B. In an ideal delta-sigma modulator the input signal charge and feedback charge at nodes A and B cancel such that only a small quantization noise charge is transferred onto integration capacitors $C_1$. In actual practice however, if the two charges do not reach the summing nodes at or approximately the same time, then a large input signal or feedback signal charge will be transferred onto the integration capacitors. If this event occurs, a large signal swing will appear at the opamp outputs.

In contrast to conventional modulator topologies, in modulator 200 the input signal and feedback charges are summed at common nodes A and B, which are disposed in front of summing switches 305. Consequently, during $\phi_1$ the charges from the input and reference capacitors and $C_{IN}$ and $C_{REF}$ are shared at Nodes A and B before summing switches 305 close and the charge is transfered to the summing nodes at the operational amplifier inputs. As indicated above, during Phase $\phi_2$ the charge from all paths are switched to charge sharing nodes A and B. This timing allows input and feedback charge from capacitors $C_{IN}$ and $C_{REF}$ to cancel at nodes A and B such that only a small quantization noise charge is transferred to the opamp inputs during Phase 2 delayed ($\phi_{2d}$) when switches 305 close.

Preferably, nodes A and B for the first integrator stage are disconnected from the signal inputs $V_{IN+}$ and $V_{IN-}$ prior to disconnection of the signal feed-forward path. Moreover, the input signal feedforward path is preferably disconnected from the modulator inputs shortly after the quantizer comparison operation. The advantage of taking these steps is the minimization of unwanted sampling of signals caused by descriptions of the feedforward path. Additionally, the feedforward path provides a possible link between the input signal and internal quantization noise. Hence attention must be paid to the design of the feedforward path to avoid possible dilution of the input signal.

Although the present invention and its advantages have been described in detail, it should be understood that various changes, substitutions and alterations can be made herein without departing from the spirit and scope of the invention as defined by the appended claims.

What is claimed is:

1. An integrator stage for use in a delta sigma modulator comprising:

an operational amplifier;

an integration capacitor coupling an output of the operational amplifier and a summing node at an input of the operational amplifier;

first and second feedback paths each including switching circuitry for selectively sampling a reference voltage onto a first plate of a corresponding capacitor during a sampling phase, a second plate of the capacitors of the feedback paths being coupled in common at a common plate node; and a switch for selectively coupling the common plate node and the summing node during an integration phase.

2. The integrator stage of claim 1 and further comprising:

a second integration capacitor coupling a second output of the operational amplifier with a second summing node at a second input of the operational amplifier;

third and fourth feedback paths each including switching circuitry for selectively sampling the reference voltage onto a first plate of a corresponding capacitor during the WSM sampling phase, a second plate of the capacitors of the third and fourth feedback paths coupled in common at a second common plate node, the third and fourth feedback paths sampling the reference voltage differentially with respects to the first and second feedback paths; and a second switch for selectively coupling the second common plate node and the second summing node during the integration phase.

3. The integrator stage of claim 1 wherein the switching circuitry comprises switches for selectively coupling and cross-coupling first and second reference voltage inputs of the corresponding feedback path in response to a control signal.

4. A delta sigma modulator comprising:

a loop filter comprising an integrator stage, the integrator stage comprising:

an operational amplifier;

an integration capacitor coupling an output of the operational amplifier and a summing node at an input of the operational amplifier; and a multiple-bit digital to analog converter comprising:

first and second capacitors having first plates coupled in common at a common node;

switching circuitry for selectively sampling a selected reference voltage onto a second plate of a corresponding one of the capacitors during a sampling phase; and switching circuitry for selectively coupling the common node with the summing node during an integration phase.

5. The delta sigma modulator of claim 4 further comprising:

an output summer coupled to outputs of the loop filter in a feedforward configuration; and a feedforward path of a selected gain coupling a loop filter input and the output summer for canceling an input signal energy into the loop filter input.

6. The delta sigma modulator of claim 5 further comprising a quantizer for feeding-back a control signal to the switching circuitry of the digital to analog converter, a gain of the feed-forward path inversely proportional to gains of the quantizer and the digital to analog converter.

7. A delta sigma modulator comprising:
a plurality of filter stages having outputs coupled to inputs of an output summer;
a feedback loop coupled to an output of the output summer and having a gain for feeding-back control signals to at least one of the filter stages; and
a feed-forward path coupling an input of the modulator and an input of the output summer and having a gain approximately inversely proportional to the gain of the feedback loop.

8. The delta-sigma modulator of claim 7 wherein the feedback loop comprises a quantizer and a DAC and the gain of the feed-forward path is approximately:

1/quantizer gain*1/DAC gain.

9. The delta sigma modulator of claim 8 wherein the feedback loop further comprises dynamic element matching logic coupling the quantizer and the DAC.

10. The delta-sigma modulator of claim 7 wherein a selected one of the filter stages comprises an integrator stage comprising:
an operational amplifier and an associated integration capacitor;
input signal switching circuitry for sampling an input signal charge onto an input sampling capacitor during a sampling phase and transferring the input signal charge to a common node during a first period of an integration phase;
reference voltage switching circuitry including switches controlled by a plurality of control signals generated by the feedback loop for sampling a reference charge onto a plurality of reference sampling capacitors during the sampling phase and transferring the reference charge to the common node during the first period of the integration phase; and
summing switches for transferring charge from the common node to the integration capacitor during a second period of the integration phase.

11. The delta-sigma modulator of claim 10 wherein selected plates of selected ones of the plurality of reference sampling capacitors are coupled electrically in common.

12. The delta sigma modulator of claim 9 wherein the switches of the reference voltage switching circuitry selectively couple the reference sampling capacitors to a selected one of first and second reference voltage rails.

13. The delta sigma modulator of claim 10 wherein the input signal switching circuitry samples the input signal charge in rough and fine subphases of the sampling phase.

14. The delta sigma modulator of claim 10 wherein the reference voltage switching circuitry samples the reference voltage in rough and fine subphases of the sampling phase.

15. The delta sigma modulator of claim 10 wherein the control signals are generated during the integration phase of a first operational cycle to configure the switches of the reference switching circuitry prior to the sampling phase of a second following operational cycle.

16. A method of operating a delta-sigma modulator including a loop filter having a plurality of outputs feeding-forward filter output signals into an output summer and a feedback loop for coupling a feedback signal from an output of the summer to an input of the loop filter comprising the step of:
feeding-forward an input signal through a feed-forward path from a modulator input to the output summer with a selected gain for canceling input signal energy into the modulator.

17. The method of claim 16 wherein said step of feeding-forward comprises the substeps of:
disconnecting an input stage of the loop filter input from the modulator input; and
subsequently disconnecting the feed-forward path from the modulator input.

18. The method of claim 17, wherein the feed-forward path is disconnected after the feedback path generates the feedback signal.

19. A method of interconnecting paths and an integration capacitor in a switched-capacitor integrator comprising the steps of:
coupling top plates of first and second reference capacitors of first and second reference paths of a selected polarity together at a common node; and
coupling a switch between the common node and the integration capacitor for selectively coupling the common node to the integration capacitor.

20. The method of interconnecting of claim 19 and further comprising the step of providing switches for selectively coupling input plates of the reference capacitors to a reference voltage of a selected polarity.

21. The method of interconnecting of claim 19 further comprising the step of coupling a top plate of an input signal sampling capacitor to the summing node.

22. A method of operating a delta sigma modulator comprising a loop filter including an integrator stage, a quantizer, first and second capacitors having common first plates, first switching circuitry for selectively sampling a selected reference voltage to a second plate of the each of the capacitors in response to a control signal generated by the quantizer, and second switching circuitry for transferring charge from the common first plates of the capacitors to the input of the integrator stage, comprising the steps of:
during a first sampling phase, sampling selected reference voltages to the second plates of the capacitors with the first switching circuitry in response to a first control signal generated by the quantizer during a prior integration phase;
during a first integration phase performing the substeps of:
selectively transferring charge from the common first plates of the first and second capacitors to the input of the integrator stage with the second switching circuitry; and
generating a second control signal with the quantizer; and
during a second sampling phase, sampling selected reference voltages to the second plates of the capacitors with the first switching circuitry in response to the second control signal generated by the quantizer.

23. The method of claim 22 wherein said step of transferring charge from the first common plates of the capacitors to the input of the integrator stage comprises the step of transferring charge to a selected one of first and second differential inputs to the integrator stage.

24. The method of claim 23 and further comprising the step of passing the first and second control signals generated by the quantizer through dynamic element matching logic prior to presentation to the first switching circuitry.

25. The method of claim 23 wherein said integration phase further comprises the step of forcing charge from the second plates of the capacitors to the common first plates of the capacitors by reversing a voltage at the second plates of the capacitors prior to said step of selectively transferring charge from the common first plates to the input of the integrator.

* * * * *